(12) United States Patent
Daggers et al.

(10) Patent No.: US 7,654,784 B2
(45) Date of Patent: Feb. 2, 2010

(54) DEVICE HOUSING WITH INTEGRAL FASTENER RETAINERS

(75) Inventors: Raymond E Daggers, Orangevale, CA (US); John M Kovach, Shoreham, NY (US)

(73) Assignee: Honeywell International Inc., Morristown, NJ (US)

( * ) Notice: Subject to any disclaimer, the term of this patent is extended or adjusted under 35 U.S.C. 154(b) by 344 days.

(21) Appl. No.: 11/343,422

(22) Filed: Jan. 31, 2006

(65) Prior Publication Data

US 2007/0177957 A1   Aug. 2, 2007

(51) Int. Cl.
    *F16B 21/18* (2006.01)
(52) U.S. Cl. .................. 411/352; 411/353; 411/360; 411/441
(58) Field of Classification Search ............. 411/352, 411/353, 360, 374, 554, 441, 999
    See application file for complete search history.

(56) References Cited

U.S. PATENT DOCUMENTS

| | | | | |
|---|---|---|---|---|
| 2,688,894 | A | * | 9/1954 | Modrey ................ 411/34 |
| 3,013,643 | A | * | 12/1961 | Perry ................ 403/224 |
| 3,021,927 | A | * | 2/1962 | Mckee, Jr. ............ 52/521 |
| 3,045,308 | A | * | 7/1962 | Tobey ................ 411/352 |
| 3,618,443 | A | * | 11/1971 | Fitzner ............... 411/352 |
| 3,820,199 | A | * | 6/1974 | Popper et al. ......... 411/352 |
| 3,921,495 | A | * | 11/1975 | Braun et al. .......... 411/441 |
| 4,216,697 | A | * | 8/1980 | Wilson ............... 411/15 |
| 4,281,773 | A | * | 8/1981 | Mengeu .............. 220/3.2 |
| 5,029,038 | A | * | 7/1991 | Covi et al. ........... 361/58 |
| 5,110,247 | A | * | 5/1992 | Losada .............. 411/441 |

(Continued)

FOREIGN PATENT DOCUMENTS

DE   4423448 A1   11/1996

(Continued)

*Primary Examiner*—Victor Batson
*Assistant Examiner*—Roberta Delisle
(74) *Attorney, Agent, or Firm*—Barkume & Associates, P.C.

(57) ABSTRACT

The present invention is a housing for a surface-mountable device such as a security device (a PIR, a microwave motion detector, and the like). The housing has a surface-mountable housing portion with at least one aperture for receiving a surface-mounting member therethrough, the housing portion fabricated substantially from a plastic material. A member-retaining portion is integrally molded with the housing portion and extends substantially perpendicular from said housing portion, said member-retaining portion adapted to receive a surface-mounting member when inserted therethrough and retain said surface-mounting member in place. As a result of this configuration, when a surface-mounting member such as a screw is inserted therethrough, the surface-mounting member is held in place by the member-retaining portion and is insertable through the aperture when pressure is applied thereto. Preferably, the aperture is circular and the member-retaining portion is substantially cylindrical with at least one slot extending along said member-retaining portion. The member-retaining portion is adapted so as to allow a user to push a surface-mounting member therethrough and to hold the surface-mounting member in place. The member-retaining portion is compressible and/or collapsible so that when a surface-mounting member is inserted therethrough so as to force the surface-mountable housing portion against a wall, the member-retaining portion is substantially compressed and/or collapsed between a head portion of the surface-mounting member and the housing portion.

6 Claims, 2 Drawing Sheets

U.S. PATENT DOCUMENTS

| | | | |
|---|---|---|---|
| 5,125,616 A * | 6/1992 | Rothenbuehler et al. | 249/3 |
| 5,178,503 A * | 1/1993 | Losada | 411/441 |
| 5,292,216 A * | 3/1994 | Van Allman | 411/441 |
| 5,630,611 A * | 5/1997 | Goss et al. | 280/728.2 |
| 5,803,691 A * | 9/1998 | Huang | 411/442 |
| 6,064,430 A * | 5/2000 | Lefkowitz | 348/151 |
| 6,162,234 A | 12/2000 | Freedland et al. | 606/151 |
| 6,174,118 B1 * | 1/2001 | Rebers et al. | 411/352 |
| 6,394,724 B1 * | 5/2002 | Kelly et al. | 411/353 |
| 6,602,027 B2 * | 8/2003 | Deaton et al. | 408/72 R |
| 7,054,442 B2 * | 5/2006 | Weikle | 379/438 |
| 7,207,762 B2 * | 4/2007 | Teal | 411/526 |
| 2004/0042873 A1 * | 3/2004 | Burmahln | 411/353 |
| 2004/0062621 A1 * | 4/2004 | Jiang et al. | 411/353 |
| 2004/0136804 A1 * | 7/2004 | Clinch et al. | 411/111 |
| 2005/0008448 A1 * | 1/2005 | Doubler et al. | 411/353 |

FOREIGN PATENT DOCUMENTS

FR      2378201      8/1978

* cited by examiner

DEVICE HOUSING WITH INTEGRAL FASTENER RETAINERS

TECHNICAL FIELD

This application relates to housings for surface-mountable devices, and in particular to a security device housing with integral fastener retainers.

BACKGROUND ART

Devices such as security devices (PIRs, motion sensors, sirens etc.), thermostats, meters, lighting fixtures, and the like are usually mounted into a wall or ceiling surface. Installers need to hold retaining screws in one hand as well as the housing to be installed while climbing a ladder, making it difficult as well as unsafe. The screw retainers of the present invention will eliminate the need to hold the screws separately.

DISCLOSURE OF THE INVENTION

The present invention is a housing for a surface-mountable device such as a security device, thermostat, and the like. The housing has a surface-mountable housing portion with at least one aperture for receiving a surface-mounting member therethrough, the housing portion fabricated substantially from a plastic material. A member-retaining portion is integrally molded with the housing portion and extends substantially perpendicular from the housing portion, the member-retaining portion being adapted to receive a surface-mounting member when inserted therethrough and retain the surface-mounting member in place. As a result of this configuration, when a surface-mounting member such as a screw is inserted therethrough, the surface-mounting member is held in place by the member-retaining portion and is insertable through the aperture when pressure is applied thereto.

Preferably, the aperture is circular and the member-retaining portion is substantially cylindrical with at least one slot or recess extending along the member-retaining portion. The member-retaining portion is adapted so as to allow a user to push a surface-mounting member such as a screw therethrough and to hold the surface-mounting member in place. The member-retaining portion is compressible and/or collapsible so that when a surface-mounting member is inserted therethrough so as to force the surface-mountable housing portion against a surface such as a wall, the member-retaining portion is substantially compressed and/or collapsed between a head portion of the surface-mounting member and the housing portion.

BEST MODE FOR CARRYING OUT THE INVENTION

Figure 2:
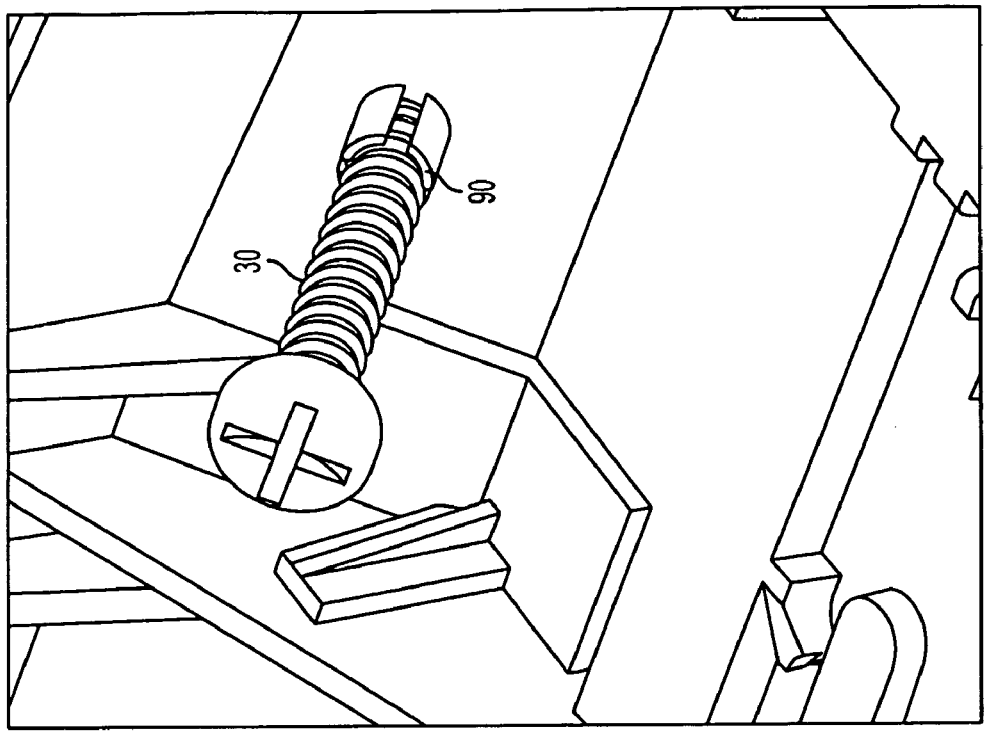
FIG. 2 is a diagram of the present invention illustrating a screw partially inserted into the member-retaining portion of the present invention.
Figure 1:
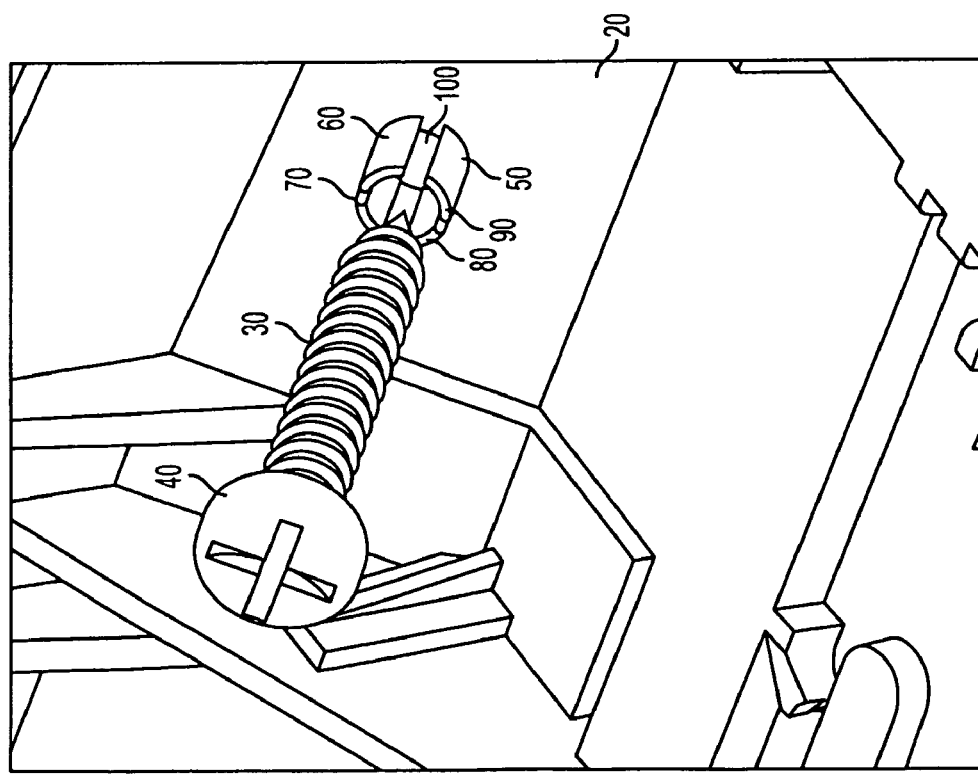
FIG. 1 is a diagram of the present invention illustrating a screw about to be inserted into the member-retaining portion of the present invention.

The preferred embodiments of the present invention will now be described with respect to the Figures. FIG. 1 shows a housing 10 for a surface-mountable security device such as a PIR, a microwave motion detector, and the like. The housing 10 has a surface-mountable housing portion 20 with various apertures for receiving a surface-mounting member therethrough. FIG. 1 shows a surface-mounting member in the form of a screw 30 which is desired to be inserted through the aperture 100 to mount the housing portion 20 to a wall (not shown). Preferably, the housing portion 20 is fabricated substantially from a plastic material as well known in the art. A member-retaining portion 90 is integrally molded with the housing portion 20 and extends substantially perpendicular from the housing portion 20 as shown. The member-retaining portion 90 is adapted to receive the screw 30 when inserted therethrough and retain the screw 30 in place as shown in FIG. 2. That is, the screw 30 is pressed by hand into the member-retaining portion 90 such that it is temporarily held in place without significantly extending out of the back of the housing portion 20, thus enabling the housing portion 20 to be easily placed against a wall without the tip of the screw causing any significant interference. The inside surface of the member retaining portion 90 may be substantially flat and need not have groves to mate with the threads of the crew since the pressure of the inside surface against the threads will be sufficient to hold the crew in place temporarily.

As a result of this configuration, when a screw 30 is inserted therethrough, the screw is held in place temporarily by the member-retaining portion 90 and is insertable through the aperture 100 when pressure is applied thereto.

Typically, the aperture 100 is circular and thus the member-retaining portion 90 is substantially cylindrical with at least one slot 100 extending therealong. As shown in the Figures, the member-retaining portion is actually comprised of four sections 50, 60, 70 and 80 separated by slots or open areas therebetween. This allows a screw 30 to be easily inserted since the four walls will be able to spread apart so as to allow the screw to easily insert and yet be held in place due to the resilience of the plastic.

Figure 3:
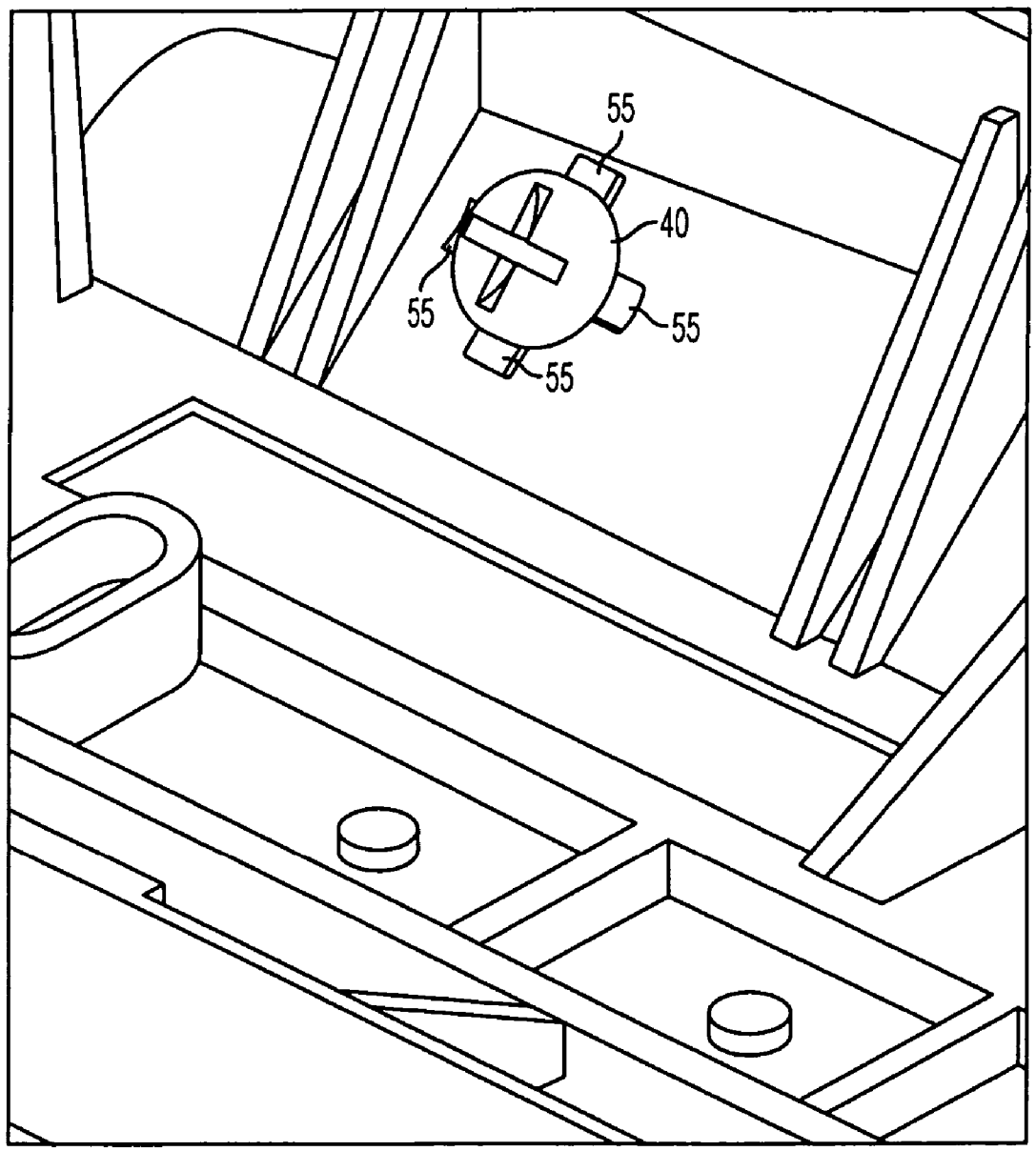
FIG. 3 is a diagram of the present invention illustrating a screw fully inserted into the member-retaining portion of the present invention.

The member-retaining portion 100 is thereby rendered compressible and/or collapsible so that when a screw 30 is inserted therethrough so as to force the surface-mountable housing portion 20 against a wall, the member-retaining portion 90 is substantially compressed and/or collapsed between a head portion 40 of the screw 30 and the housing portion 20. As shown in FIG. 3, sections 50, 60, 70 and 80 have compressed/collapsed into flattened sections 55, allowing the head of the screw to retain the housing portion 20 snugly in place. The term collapsed in this respect includes compression and/or flattening as well, as used herein.

This allows an installer to easily place the screws 30 into the member-retaining portions 90 of the housing portion 20 just before installation and easily install the screws by holding a screwdriver in one hand and the housing portion 20 in the other hand, alleviating the need to also hold screws in place in the aperture as in the prior art.

What is claimed is:

1. A housing suitable for encasing a security device comprising:
   a. a surface-mountable housing portion comprising at least one aperture for receiving a surface-mounting member therethrough; and
   b. a member-retaining portion integrally molded with said housing portion and extending substantially perpendicular from said housing portion, said member-retaining portion comprising a plurality of sections comprising substantially smooth inside surfaces and extending substantially perpendicularly from said housing portion, said sections hold a threadedly surface-mounting member in place in the member-retaining portion by the inside surfaces engaging the thread, and to spread apart and substantially flatten in a direction away from said surface-mounting member between a head portion of said surface-mounting member and said housing portion when said head of said surface mounting member is urged perpendicularly against said member-retaining portion so as to urge said housing against a mounting surface, said sections remaining connected to said housing portion after said head of said surface mounting member is urged perpendicularly against said member-retaining portion so as to urge said housing against a mounting surface.

2. The housing of claim 1, wherein said aperture is circular and said member-retaining portion is substantially cylindrical.

3. The housing of claim 2, wherein said member-retaining portion has at least one slot extending along said member-retaining portion.

4. A method for mounting a housing suitable for encasing a security device
comprising the steps of:
 a. providing a surface-mountable housing portion comprising at least one aperture for receiving a surface-mounting member therethrough;
 b. providing a member-retaining portion integrally molded with said housing portion and extending substantially perpendicular from said housing portion, said member-retaining portion comprising a plurality of sections comprising substantially smooth inside surfaces and extending substantially perpendicularly from said housing portion, said sections hold a threadedly surface-mounting member in place in the member-retaining portion by the inside surfaces engaging the thread, and to spread apart and substantially flatten in a direction away from said surface-mounting member between a head portion of said surface-mounting member and said housing portion when said head of said surface mounting member is urged perpendicularly against said member-retaining portion so as to urge said housing against a mounting surface;
 c. pressing a surface-mounting member partially into the member-retaining portion such that it is held in place; and
 d. inserting the surface-mounting member further through the member-retaining portion such that said sections of said member-retaining portion spread apart and substantially flatten in a direction away from said surface-mounting member between a head portion of said surface-mounting member and said housing portion so as to urge said housing against a mounting surface, said sections remaining connected to said housing portion after said head of said surface mounting member is urged perpendicularly against said member-retaining portion so as to urge said housing against a mounting surface.

5. The method of claim 4 wherein said aperture is circular and said member-retaining portion is substantially cylindrical.

6. The method of claim 5 wherein said member-retaining portion has at least one slot extending along said member-retaining portion.

* * * * *